United States Patent [19]

Inagaki

[11] Patent Number: 4,716,551
[45] Date of Patent: Dec. 29, 1987

[54] SEMICONDUCTOR MEMORY DEVICE WITH VARIABLE SELF-REFRESH CYCLE

[75] Inventor: Yasaburo Inagaki, Tokyo, Japan

[73] Assignee: NEC Corporation, Tokyo, Japan

[21] Appl. No.: 650,153

[22] Filed: Sep. 13, 1984

[30] Foreign Application Priority Data

Sep. 14, 1983 [JP] Japan .................... 58-169773

[51] Int. Cl.⁴ .............................................. G11C 7/00
[52] U.S. Cl. .................................. 365/222; 365/212; 307/301
[58] Field of Search ............... 365/222, 211, 212, 227, 365/109; 307/310

[56] References Cited

U.S. PATENT DOCUMENTS

| | | | |
|---|---|---|---|
| 3,705,392 | 12/1972 | Appelt | 365/222 |
| 3,851,316 | 11/1974 | Kodama | 365/222 |
| 4,390,972 | 6/1983 | Machida | 365/222 |
| 4,393,477 | 7/1983 | Murotani | 365/222 |

FOREIGN PATENT DOCUMENTS

| | | | |
|---|---|---|---|
| 0019142 | 11/1980 | European Pat. Off. | 365/222 |
| 0013588 | 2/1981 | Japan | 365/222 |
| 0083888 | 7/1981 | Japan | 365/222 |

OTHER PUBLICATIONS

Yamada et al., "A 64k Bit MOS Dynamic Ram with Auto/Self Refresh Functions", Electronics and Communications in Japan, vol. 66–C, No. 1, Jan. 1983, pp. 103–110.

Primary Examiner—Stuart N. Hecker
Assistant Examiner—Glenn A. Gossage
Attorney, Agent, or Firm—Sughrue, Mion, Zinn, Macpeak & Seas

[57] ABSTRACT

A semiconductor memory device with an internal refresh circuit is disclosed. The internal refresh circuit includes a timer circuit which generates a refresh request signal in a shorter cycle at a high temperature and in a longer cycle at a low temperature. The cycle of a self-refresh mode can be thereby lengthened in a low temperature to reduce a power consumption in the self-refresh mode.

10 Claims, 6 Drawing Figures

SEMICONDUCTOR MEMORY DEVICE WITH VARIABLE SELF-REFRESH CYCLE

BACKGROUND OF THE INVENTION

The present invention relates to a pseudo-static semiconductor memory device, and more particularly to an internal refresh circuit of the memory device with a variable cycle of self-refresh operation.

A semiconductor dynamic memory device has a very large memory capacity with a low cost because of a very simple memory cell structure. It uses the so-called "one transistor memory cell" which consists of one insulated gate field effect transistor (IGFET) such as an MOS (Metal-Oxide-Semiconductor) transistor and one storage capacitor. Since the charges stored in the memory cell capacitor decrease by leakage, they should be restored periodically through a refresh operation. The refresh operation in the dynamic memory device is carried out by supplying external address signals in synchronism with external clock signals, but a control circuit of the external clock is complicated.

To avoid the complicated external circuit, a memory device provided with an internal refresh circuit has been proposed. Such a memory device is called as a "pseudo-static memory device". The internal refresh circuit includes a refresh control circuit, an internal address counter and a timer circuit. The refresh control circuit is activated by a refresh signal applied externally to a refresh terminal of the memory device, to supply the content of the internal address counter to a row decoder as a row address signal. The row decoder selects one of the rows of a memory cell array to refresh the memory cells on the selected row. Thereafter, the internal address counter is incremented or decremented by one. On the other hand, the refresh control circuit enables the timer circuit, which thereby generates a refresh request signal in a predetermined time period. In response to the refresh request signal, the incremented or decremented content of the internal address counter is supplied to the row decoder to select the next row and the memory cells on the next row are refreshed. The content of the internal address counter is then further incremented or decremented by one and supplied to the row decoder in response to a next refresh request signal generated in a predetermined cycle. Thus, the self-refresh operation continues at each time when the timer circuit generates the refresh request signal, so long as the refresh signal is applied, with a cycle equal to the cycle of generation of the refresh request signal.

If the refreshing interval is too long, the leakage of the storage capacitor makes it impossible to determine whether the stored information is "1" or "0". The critical time interval is called a "data-hold time". Accordingly, the cycle of the self-refresh operation, i.e., the generation cycle of the refresh request signal in the timer circuit, should be selected such that all the memory cells are refreshed at least once within the data-hold time.

As an ambient temperature increases, the leakage of the storage capacitor becomes large and the data-hold time becomes short. Therefore, the generation cycle of the refresh request signal should be as short as possible in order that all the memory cells be refreshed within the data-hold time even in a highest ambient temperature. This means that the refresh operation is unnecessarily done many times in room temperature or in a lower temperature. Since a power consumption in the refresh operation depends upon times of refresh operation, it rises as the cycle of the self-refresh operation becomes short and the unnecessary refresh operation brings about an unnecessary power consumption. The self-refresh operation is generally carried out in the standby condition of the memory device, wherein a back-up power source such as a battery is used as a power source of the memory device. Accordingly, power consumption is unnecessarily large in the standby condition.

SUMMARY OF THE INVENTION

An object of the present invention is, therefore, to provide a semiconductor memory device in which power consumption in a self-refresh mode is reduced.

Another object of the present invention is to provide a semiconductor memory device in which the cycle of the self-refresh operation is variable.

It is still another object of the present invention to provide a semiconductor memory device equipped with an internal refresh circuit having a timer circuit which generates a refresh request signal in a variable cycle.

A memory device according to the present invention comprises a plurality of memory cells, a decoder means for selecting at least one of the memory cells, an internal refresh circuit having an internal address counter, means for periodically generating a refresh request signal in a variable cycle, and means responsive to the refresh request signal for supplying the content of the internal address counter to said decoder means, and a control circuit controlling the generating means to determine the refresh request signal generating cycle in accordance with the data-hold characteristic of the memory cell. If the data-hold time of the memory cell is short, the control circuit controls the generating means such that the refresh request signal is generated in a shorter cycle than a normal cycle, so that the data stored in all the memory cells may be refreshed at least once prior to the disappearance of the stored information, When the data-hold time of the memory cell is normal or longer, the refresh request signal is generated in a normal or longer cycle. Therefore, the unnecessary refresh operation is prevented and power consumption is reduced.

In an embodiment of the invention, the control circuit controls the generating means in response to a signal representing an ambient temperature. For example, when the ambient temperature is relatively high, a detection signal is generated and the control circuit thereby controls the generating means such that the refresh request signal is generated in a shorter cycle. When the ambient temperature is normal or low, a different signal is generated or no signal is generated, and the refresh request signal is thereby generated in a normal or a longer cycle. Consequently, the respective memory cells are refreshed securely over the operable temperature range, and power consumption is reduced in the self-refresh operation in the normal or low temperature. In this case, a temperature sensor detecting the ambient temperature may be provided either outside or inside the semiconductor chips of the memory device. If the temperature sensor is provided externally, the temperature detection signal can be supplied to a terminal that is not employed in the self-refresh operation.

BRIEF DESCRIPTION OF THE DRAWINGS

The above and other objects, features and advantages of the present invention will become more apparent from the following description taken in conjunction with the accompanying drawings, wherein.

DETAILED DESCRIPTION OF THE PREFERRED EMBODIMENTS

Figure 1:
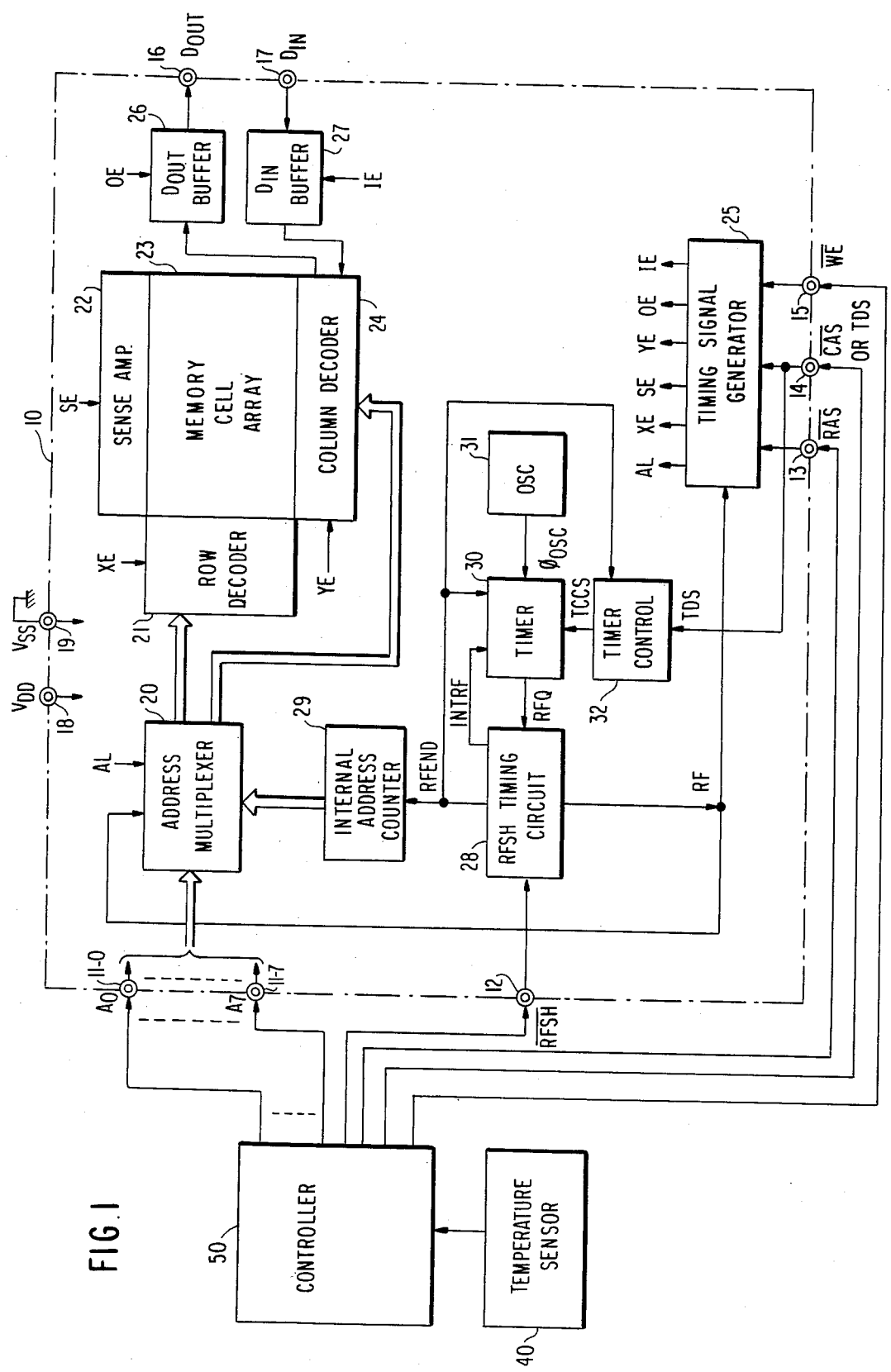
FIG. 1 is a block diagram of a memory device according to one embodiment of the present invention.

Referring to FIG. 1, a memory device according to one embodiment of the present invention is formed as an integrated circuit device 10. This memory device is of the so-called "two clock multi-address input type", in which row and column address signals A0 to A7 are supplied to address input terminals 11-0 to 11-7 in synchronism with row and column address strobe signals $\overline{RAS}$ and $\overline{CAS}$ supplied to terminals 13 and 14, respectively. When the row address strobe ($\overline{RAS}$) signal is changed, e.g., from a high level to a low level, a timing signal generator 25 produces an address latch signal AL in one-shot pulse shape. This signal AL activates an address mulitplexer 20 to transfer the address signals A0 to A7 from the address input terminals 11-0 to 11-7 to a row decoder 21 as a row address. The timing signal generator 25 further generates a row decoder activating signal XE and a sense-enable signal SE. The row decoder 21 selects one of row lines (word lines) in a memory cell array 23 in accordance with the row address signal. The memory cell array 23 includes a plurality of row (word) and column (digit) lines and a plurality of memory cells disposed at the respective intersections of the row and column lines. Each of the memory cells is one transistor memory cell consisting of one MOS transistor and one storage capacitor. The data stored in the memory cells on the selected row line are read out to column lines, amplified by sense amplifiers 22, and read out to a data output terminal $D_{OUT}$ 16 through an output buffer 26, if the same 26 is enabled by a signal OE. The smae data as the read-out data are restored in the memory cells on the selected row line. That is, the data refresh is attained.

When the column address strobe ($\overline{CAS}$) signal supplied to a terminal 14 is changed from a high level to a low level after the $\overline{RAS}$ signal has been changed to the low level, the timing signal generator 25 generates the signal AL again, and the address multiplexer 20 transfers the address signal A0 to A7 to a column decoder 24 as a column address. The timing signal generator 25 further produces a column decoder activating signal YE which activates the column decoder 24 to select one of the column (digit) lines. In this case, the memory cell disposed at the intersection of the selected row and column lines is selected and a data is written into it or read-out from it.

When a write-enable ($\overline{WE}$) signal supplied to a terminal 15 is at a high level, the timing generator 25 produces an output-enable signal OE, but does not produce an input-enable signal IE. Accordingly, a data-out buffer 26 is activated to output the data stored in the selected memory cell at a data-out terminal ($D_{OUT}$) 16. When the signal $\overline{WE}$ takes a low level, the signal IE is produced, so that a data supplied to a data-in terminal ($D_{IN}$) 17 is written into the designated memory cell through a data-in buffer 27. A power source to the memory device is connected between a $V_{DD}$ terminal 18 and a $V_{SS}$ terminal 19.

The timing relation of the external clock signals $\overline{RAS}$, $\overline{CAS}$ and $\overline{WE}$ and that between the external clock signals and the address input signals are controlled by an external controller 50 such as a CPU (Central Processing Unit) or the like.

The memory device shown in FIG. 1 further includes an internal refresh circuit to perform the periodic refresh of the data stored in the respective memory cells. The internal refresh circuit is controlled by a refresh ($\overline{RFSH}$) signal supplied to a terminal 12 from the controller 50. In the memory operation mode, the $\overline{RFSH}$ signal is held at a high level to inactivate the internal refresh circuit. When the memory device is in a data-hold state or a standby mode, the $\overline{RFSH}$ signal is changed to a low level to activate the internal refresh circuit, so that an internal refresh operation is performed. This mode is therefore called an internal refresh mode.

The internal refresh circuit includes a refresh timing circuit 28, an internal address counter 29, a timer circuit 30, an oscillator 31, and a timer control circuit 32 which is provided according to the present invention. In the internal refresh mode, the controller 50 holds the $\overline{RAS}$ signal at a high level, by which the timing signal generator 25 refuses the $\overline{CAS}$ signal and $\overline{WE}$ signal, in order to inhibit the external address signals from being transferred to the row decoder and inhibit writing the data. In response to the $\overline{RFSH}$ signal of the low level, the RFSH timing circuit 28 generates an internal refresh control signal RF, which is supplied to the address multiplexer 20 to transfer signals not from the address input terminals 11-0 to 11-7 but from the internal address counter 29 to the row decoder 21 as a row address. The signal RF is also supplied to the timing signal generator 25, which thereby produces the signals XE and SE. As a result, the row decoder 21 selects one of the row lines in accordance with the content of the internal address counter 29, and the data stored in the memory cells on the selected row line are amplified by the sense amplifiers 22 and restored into the same memory cells. That is, the refresh of the memory cells on one row line is carried out. The RFSH timing circuit 28 also produces an internal refresh signal INTRF to activate the timer circuit 32.

When the above-mentioned refresh operation on one row line is terminated the RFSH timing circuit 28 supplies a refresh end signal RFEND to the internal address counter 29 and the timer circuit 30. As a result, the content of the counter 29 is incremented by one. If desired, the content may be decremented by one. The timer circuit 30 already activated by the signal INTRF starts a timer operation in response to the signal RFEND by utilizing an oscillation signal from the oscillator 31. The timer 30 generates a refresh request signal RFQ periodically in a predetermined cycle time. More specifically, the timer 30 generates the signal RFQ every time when the signal RFEND is applied thereto, with a predetermined delay of time from application of the signal RFEND. The oscillation signal of the oscillator 31 is also utilized to produce a predetermined bias voltage to a semiconductor substrate (not shown) of the integrated circuit device 10.

The signal RFEND is further supplied to the timer control circuit 32. The input end of the circuit 32 is connected to the terminal 14. It should be noted that the timing signal generator 25 refuses the signal supplied to the terminal 14 in the self-refresh mode. Accordingly, a signal other than the $\overline{CAS}$ signal can be supplied to the terminal 14 in the self-refresh mode. The external controller 50 receives the output of a temperature sensor 40 detecting the temperature around the memory device 10, and supplies a temperature detection signal TDS to the terminal 14 in the self-refresh mode. The temperature sensor 40 may be constituted by a temperature sensitive resistor element such as a thermistor or the like, or a transistor circuit detecting change in a threshold voltage of a MOS transistor caused by the change in temperature. The sensor 40 is provided on a board along with at least the memory device 10 to detect the ambient temperature of the device 10. In this embodiment, the signal TDS from the controller 50 takes a high level when the ambient temperature is equal to or higher than 45° C. and a low level when it is lower than 45° C.

The timer control circuit 32 is activated by the refresh end signal RFEND to detect the level of the signal TDS, and produces a timer cycle control signal TCCS. The circuit 32 is inactivated in the memory operation mode not to detect the level of the $\overline{CAS}$ signal. The signal TCCS takes a low level when the signal TDS is in a high level and a high level when the latter is in a low level. The level of the signal TCCS changes a delay time from the time point when the signal RFEND is applied to the time point when the signal RFQ is generated. When the signal TCCS takes a low level, that is, when the ambient temperature is 45° C. or higher, the delay time is made shorter, which means that the generation cycle of the refresh request signal RFQ is shorter. On the contrary, the delay time is long when the signal TCCS take a high level, that is, when the temperature is lower than 45° C.

The signal RFQ from the timer circuit 30 is supplied to the RFSH timing circuit 28, which thereby generates the signal RF again. Consequently, the incremented (or decremented) content of the internal address counter 29 is supplied to the row decoder 21 as a next row address and the next row line is selected to refresh memory cells on the next row line. Then, the RFSH timing circuit 28 generates the refresh end signal RFEND, which further increments (or decrements) the content of the counter 29 by one and also drives the timer circuit 30 to generate the signal RFQ with the delay time controlled by the level of the signal TCCS.

As already mentioned, the data-hold time of each memory cell is shortened when the ambient temperature rises, due to the increase in leakage of the storage capacitor. The timer circuit 30 receives the low level of the signal TCCS in this case and generates the refresh request signal RFQ periodically in such a short cycle that all of the memory cells is refreshed at least once in a high temperature of 45° C. or more. On the other hand, when the ambient temperature becomes a room temperature or a low temperature, the data-hold time of the memory cell is lengthened, and the generation cycle of the signal RFQ becomes longer by the high level of the signal TCCS representing that the ambient temperature is lower than 45° C. As a result, the cycle of the self-refresh operation becomes long to reduce a power consumed for the self-refresh operation.

Figure 2:
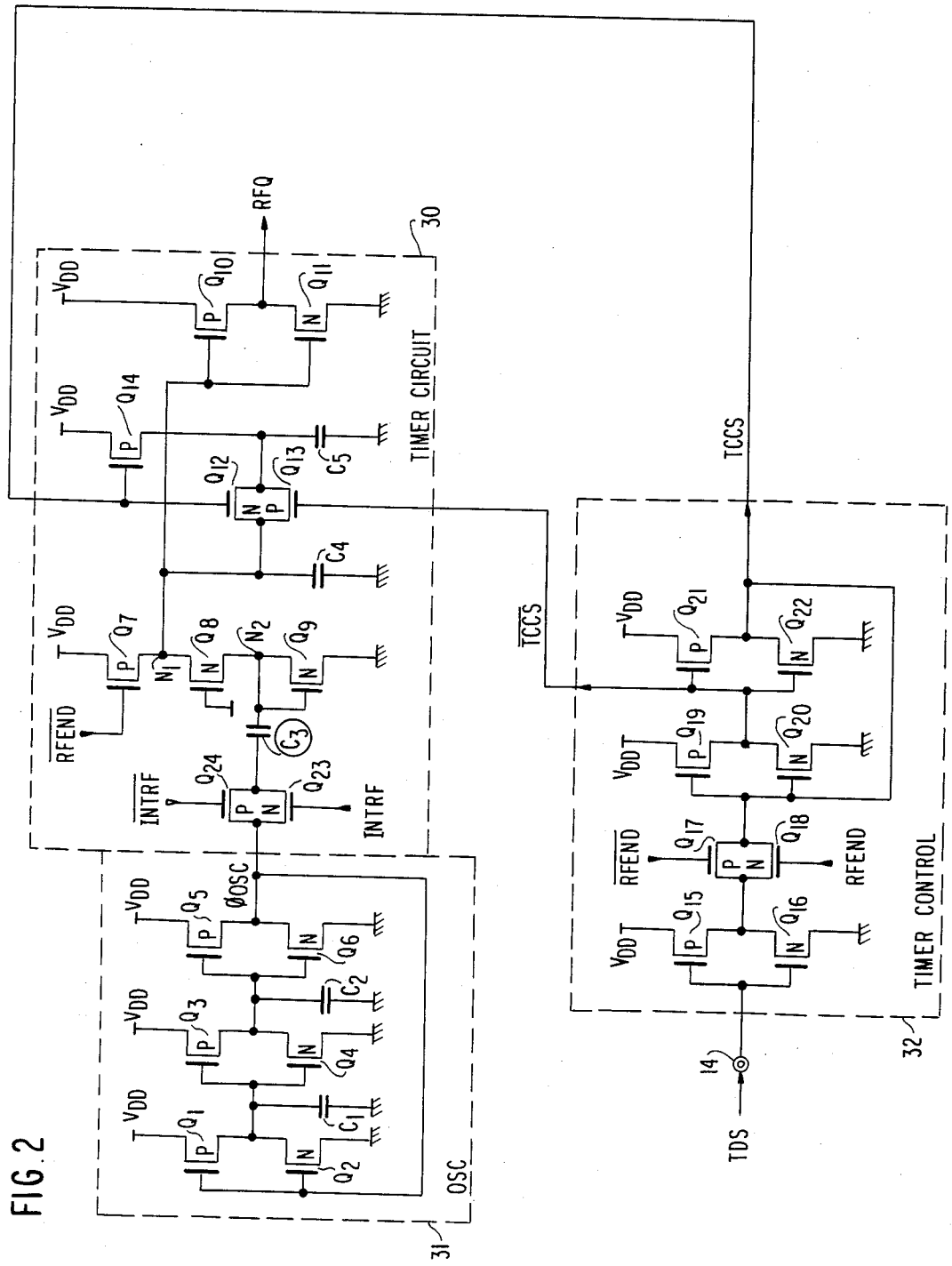
FIG. 2 is a circuit diagram showing three blocks of FIG. 1.

Referring to FIG. 2, which shows circuit arrangements of the timer circuit 30, the oscillator 31 and the timer control circuit 32, the circuit operation for changing the generation cycle of the signal RFQ will be described in detail. The oscillator 31 includes first to third complementary MOS (CMOS) inverters connected in cascade and two capacitors $C_1$ and $C_2$. The first to third inverters are constituted by pairs of P-channel and N-channel MOS transistors $Q_1$ and $Q_2$, $Q_3$ and $Q_4$, and $Q_5$ and $Q_6$, respectively. The capacitor $C_1$ is connected between the ground point and the connection point of the first and second inverters, and the capacitor $C_2$ is connected between the ground point and the connection point of the second and third inverters. The output of the third inverter is fed back to the input of the first inverter, and the oscillation signal $\phi_{OSC}$ is derived from the output end of the third inverter.

The timer circuit 30 includes a CMOS transmission gate composed of N- and P-channels MOS transistors $Q_{23}$ and $Q_{24}$. The gates of the transistors $Q_{23}$ and $Q_{24}$ are supplied with the signal INTRF and its inverted signal $\overline{INTRF}$ from the RFSH timing circuit 28, respectively. The oscillation signal $\phi_{OSC}$ is supplied to the input end of this CMOS transmission gate. When the timing circuit 28 generates the signals INTRF and $\overline{INTRF}$ respectively taking a high and low level, the transistors $Q_{23}$ and $Q_{24}$ are made conductive to activate the timer circuit 30 and the signal $\phi_{OSC}$ is supplied through the transmission gate and a capacitor $C_3$ to a node $N_2$. The gate and drain of an N-channel MOS transistor $Q_9$ is connected in common to the node $N_2$. P- and N-channel MOS transistors $Q_7$ and $Q_8$ are connected in series between a power supply terminal $V_{DD}$ and the node $N_2$. The gate of the transistor $Q_7$ is supplied with the inverted signal $\overline{RFEND}$ of the signal RFEND, and the gate of the transistor $Q_8$ is grounded. A capacitor $C_4$ is connected between the ground point and a node $N_1$ between the transistors $Q_7$ and $Q_8$, and the potential at the node $N_1$ is supplied to a complementary MOS inverter composed of P- and N-channel MOS transistors $Q_{10}$ and $Q_{11}$ which outputs the refresh request signal RFQ. The timer circuit 30 further includes an N-channel MOS transistor $Q_{12}$, P-channel MOS transistors $Q_{13}$ and $Q_{14}$, and a capacitor $C_5$ in order to change the delay time, or the cycle time. The transistor $Q_{14}$ and capacitor $C_5$ are connected in series between the $V_{DD}$ terminal and the ground. The CMOS transmission gate composed of the transistors $Q_{12}$ and $Q_{13}$ is connected between the node $N_1$ and connection point of the transistor $Q_{14}$ and the capacitor $C_5$. The gates of the transistors $Q_{12}$ and $Q_{14}$ are supplied with the timer cycle control signal TCCS, and the gate of the transistor $Q_{13}$ supplied with its inverted signal $\overline{TCCS}$. Before explaining the circuit construction of the timer control circuit 32, the timer operation of the timer 30 will be described with reference to FIG. 3.

When the $\overline{RFSH}$ signal is changed from the high to low level at a time point $T_1$, the signal INTRF and $\overline{INTRF}$ take a high level and a low level, respectively, so that the transistors $Q_{23}$ and $Q_{24}$ are made conductive. At this time, the capacitor $C_4$ is not charged, and therefore the node $N_1$ is in a low level and the signal RFQ takes a high level. When the internal refresh operation for a first row line ends at a time point $T_2$, the signal RFEND is generated and therefore signal $\overline{RFEND}$ at the gate of $Q_7$ is inverted to a low level. Accordingly, the transistor $Q_7$ is turned on to charge the capacitor $C_4$, so that the node $N_1$ rises to a high level and the signal RFQ is changed to a low level. The timer circuit 30 starts the timer operation. When the oscillation signal $\phi_{OSC}$ is changed from a high to low level at a time point $T_3$, the potential at the node $N_2$ is lowered due to the capacitance-coupling by the capacitor $C_3$, so that the transistor $Q_8$ is made conductive. Consequently, a part of the charge in the capacitor $C_4$ flows into the node $N_2$ through the transistor $Q_8$, and the potential at the node $N_1$ is slightly decreased as indicated by a solid line in FIG. 3. At a time point $T_4$, the signal $\phi_{OSC}$ is changed from the low to high level, so that the potential at the node $N_2$ will tend to increase. However, the transistor $Q_9$ is turned on to lower the potential at the node $N_2$. In such a manner, the potential at the node $N_1$ is lowered stepwise at each time when the signal $\phi_{OSC}$ is changed from the high to low level (see time points $T_3$, $T_5$, $T_6$, and $T_7$). When the potential at the node $N_1$ becomes lower than the threshold voltage of the inverter consisting of the transistors $Q_{10}$ and $Q_{11}$ at a time point $T_7$, the transistor $Q_{10}$ is made conductive to invert the output to the high level and the signal RFQ is generated. After a next internal refresh operation by the signal RFQ ends at a time point $T_8$, the signal $\overline{RFEND}$ becomes the low level to charge the capacitor $C_4$. The potential at the node $N_1$ is changed to the high level, and the signal RFQ take the low level. The timer circuit starts the timer operation again, so that the signal RFQ is generated at a time point $T_{10}$ after a time interval, or a delay of time, $(T_{10}-T_8)$ that is equal to $(T_7-T_2)$. The signal $\overline{RFEND}$ is changed to the low level at a time point $T_{12}$ when the third refresh operation ends.

Figure 3:
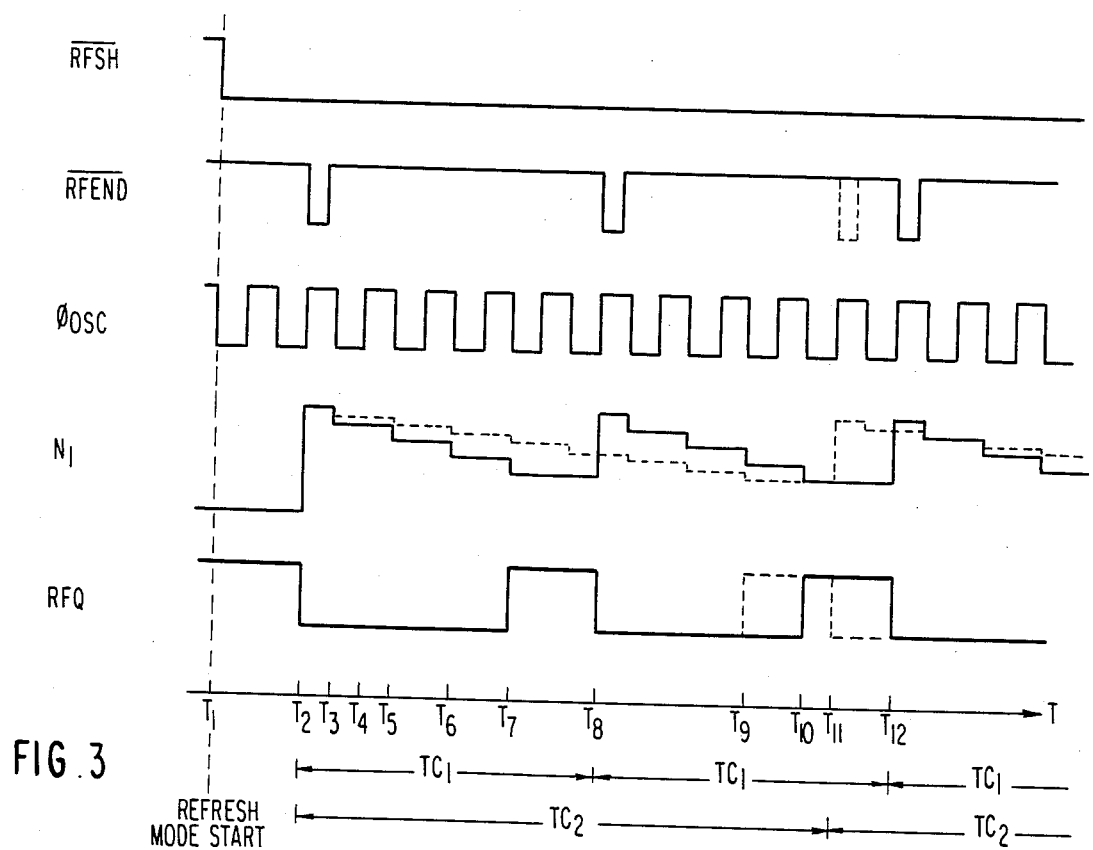
FIG. 3 is a signal waveform diagram for explaining a timer operation of FIG. 2.

The above-mentioned operation occurs when the signal TCCS takes the low level. In other words, the ambient temperature is high. The low level TCCS makes the transistors $Q_{12}$ and $Q_{13}$ nonconductive and the capacitor $C_5$ is isolated from the node $N_1$. Accordingly, the self-refresh operation is carried out in a cycle $TC_1$ as shown in FIG. 3. This cycle $TC_1$ is determined by the delay time $(T_7-T_2)$ or $(T_{10}-T_8)$, which in turn depends on the frequency of the signal $\phi_{OSC}$ and capacitance of the capacitor $C_4$, and by the time period $(T_8-T_7)$ or $(T_{12}-T_{10})$ necessary for each refresh operation.

When the signal TCCS has the high level by a lower ambient temperature, the transistors $Q_{12}$ and $Q_{13}$ are made conductive to connect the capacitor $C_5$ with the capacitor $C_4$ in parallel thereby to increase the capacitance at the node $N_1$. The transistor $Q_{14}$ is used for precharging the capacitor $C_5$, and thus may be omitted. Since both of the capacitors $C_4$ and $C_5$ are charged, the decrease in potential at the node $N_1$ caused by the conduction of the transistor $Q_8$ becomes small. Accordingly, the change in potential at the node $N_1$ is represented by a dotted line in FIG. 3, so that the signal RFQ is generated with a longer delay at a time point $T_9$. The refresh end signal $\overline{RFEND}$ is changed to the low level at a time point $T_{11}$ after the next refresh operation which takes the time period $(T_{11}-T_9)$ equal to $(T_8-T_7)$ or $(T_{12}-T_{10})$, to charge the capacitors $C_4$ and $C_5$ and thereby begin the timer operation. Thus, the cycle of the self-refresh operation is lengthened to the cycle $TC_2$ which consists of the longer delay $(T_9-T_2)$ and the refresh time $(T_{11}-T_9)$. The cycle $TC_2$ is controllable by selecting the capacitance value of the capacitor $C_5$.

Turning back to FIG. 2, the timer control circuit 32 includes a CMOS inverter composed of P- and N-channel MOS transistors $Q_{15}$ and $Q_{16}$ which receives the temperature detection signal TDS supplied to the terminal 14, a CMOS transmission gate composed of P- and N-channel MOS transistors $Q_{17}$ and $Q_{18}$ which is controlled by the signal RFEND and $\overline{RFEND}$, and a flip-flop circuit composed of P-channel MOS transistors $Q_{19}$ and $Q_{21}$ and N-channel MOS transistors $Q_{20}$ and $Q_{22}$.

Figure 4:
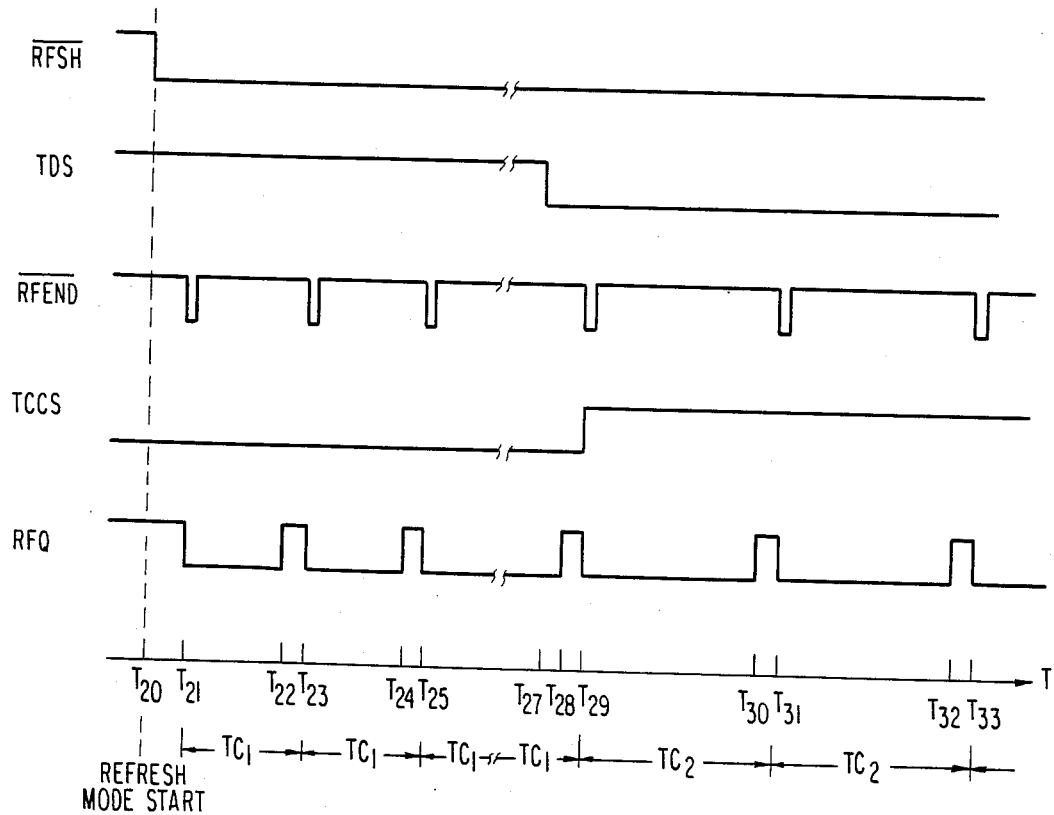
FIG. 4 is a signal waveform diagram for explaining a cycle changing operation of FIG. 2.

The circuit operation for changing the self-refresh cycle will be described with reference to FIG. 4, when the $\overline{RFSH}$ signal is changed from the high to low level at a time point $T_{20}$ for the purpose of the self-refresh mode, the first refresh operation is performed and the signal $\overline{RFEND}$ is then inverted to the low level. The timer operation starts thereby. When the controller 50 (FIG. 1) holds the signal TDS at the high level by the information from the temperature sensor 40 representing that the ambient temperature is 45° C. or higher, the signal TDS is inverted to the low level by the inverter composed of the transistors $Q_{15}$ and $Q_{16}$ and latched in the flip-flop composed of the transistors $Q_{19}$ to $Q_{22}$ in synchronism with the signal $\overline{RFEND}$. Consequently, the signals TCCS and $\overline{TCCS}$ takes the low level and high level, respectively. The levels of the signals TCCS and $\overline{TCCS}$ is held until the signal $\overline{RFEND}$ is changed to the low level. Such signals TCCS and $\overline{TCCS}$ make the transistors $Q_{12}$ and $Q_{13}$ nonconductive and isolates the capacitor $C_5$ from the node $N_1$. Accordingly, the timer cycle is shortened to the cycle $TC_1$. At a time point $T_{23}$ after the second refresh operation ends, the controller 50 still holds the signal TDS at the high level, and hence the level of the signal TCCS is not changed and the self-refresh operation is carried out in the same shorter cycle $TC_1$.

When the temperature sensor 40 (FIG. 1) detects that the ambient temperature becomes lower than 45° C. at a time point $T_{27}$, the signal TDS is inverted from the high to low level. The inverted level (i.e., high level) of the thus changed signal TDS is latched by the flip-flop composed of the transistors $Q_{19}$ to $Q_{22}$ when the refresh end signal $\overline{RFEND}$ is inverted to the low level at a time point $T_{29}$, so that the signal TCCS is changed to the high level. The transistors $Q_{12}$ and $Q_{13}$ are made conductive to connect the capacitor $C_5$ in parallel with the capacitor $C_4$ and the cycle of generation of the signal RFQ is lengthened to $TC_2$ as already described.

As described above, in the memory device according to the present invention, the cycle of the self-refresh is made short in a high temperature and is made long in a lower or room temperature. Accordingly, the data stored in all the memory cells are refreshed surely over the operable temperature range, and the power consumption in the lower or room temperature is reduced.

The signal TDS may be applied to the write-enable terminal 15 or to one of the address input terminals 11-0 to 11-7 instead of the terminal 14. Two or more additional capacitors instead of one capacitor $C_5$ may be selectively connected in parallel with the capacitor $C_4$ through a transmission gate or like, whereby the cycle of the self-refresh can be changed over in accordance with three or more ambient temperatures. In this case, the additional capacitors are selectively connected to the capacitor $C_4$ by the temperature detection signals supplied to two or more terminals such as the terminals 14, 15, etc. If desired, the temperatures sensor 40 may be fabricated within the integrated circuit device 10. Of course, the temperature detected by the sensor 40 is not limited to 45° C., but may be modified to another temperature in accordance with the data-hold characteristic of the memory cell. Also, it may detect two or more temperatures.

Figure 5:
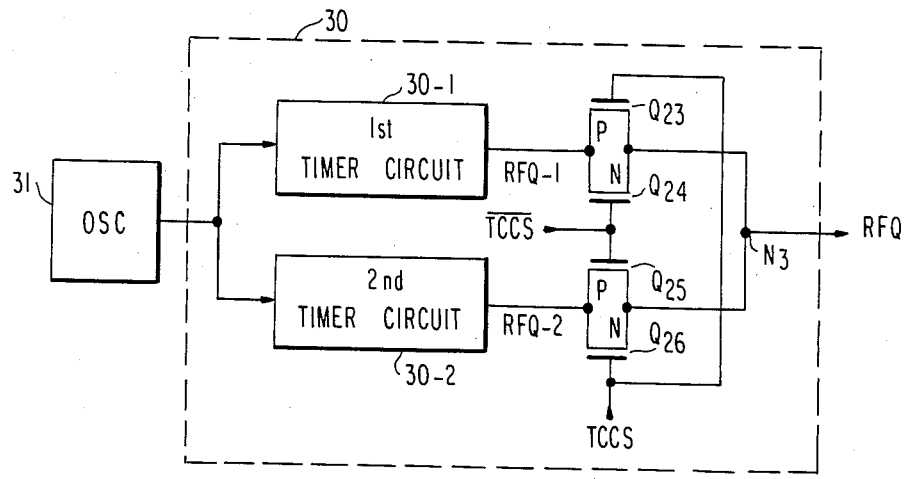
FIG. 5 is a block diagram showing another embodiment of the present invention.

FIG. 5 shows another embodiment of the present invention. A first timer circuit 30-1 generates a first refresh request signal RFQ-1 in a first cycle, and a second timer circuit 30-2 generates a second refresh request signal RFQ-2 in a cycle that is longer than the first cycle. The first and second timer circuits 30-1 and 30-2 may be constituted by the circuit part shown in FIG. 2 except for the transistors $Q_{12}$ to $Q_{13}$ and capacitor $C_5$, respectively, but the capacitance value of the capacitor $C_4$ is unequal between the timers 30-1 and 30-2. The signal RFQ-1 is supplied to a node $N_3$ through a transmission gate composed of P- and N-channel MOS transistors $Q_{23}$ and $Q_{24}$. The node $N_3$ is alternatively supplied with the signal RFQ-2 through a transmission gate composed of P- and N-channel MOS transistors $Q_{25}$ and $Q_{26}$. The signal at the node $N_3$ is the refresh request signal RFQ. The gates of the transistors $Q_{23}$ and $Q_{26}$ are supplied with the signal TCCS, and the signal $\overline{TCCS}$ is supplied to the gates of $Q_{24}$ and $Q_{25}$. supplied to two or more terminals such as the terminals 14, 15, etc. If desired, the temperature sensor 40 may be fabricated within the integrated circuit device 10. Of course, the temperature detected by the sensor 40 is not limited to 45° C., but may be modified to another temperature in accordance with the data-hold characterristic of the memory cell. Also, it may detect two or more temperatures.

FIG. 5 shows another embodiment of the present invention. A first timer circuit 30-1 generates a first refresh request signal RFQ-1 in a first cycle, and a second timer circuit 30-2 generates a second refresh request signal RFQ-2 in a cycle that is longer than the first cycle. The first and second timer circuits 30-1 and 30-2 may be constituted by the circuit part shown in FIG. 2 except for the transistors $Q_{12}$ to $Q_{13}$ and capacitor $C_5$, respectively, but the capacitance value of the capacitor $C_4$ is unequal between the timers 30-1 and 30-2. The signal RFQ-1 is supplied to a node $N_3$ through a transmission gate composed of P- and N-channel MOS transistors $Q_{23}$ and $Q_{24}$. The node $N_3$ is alternatively supplied with the signal RFQ-2 through a transmission gate composed of P- and N-channel MOS transistors $Q_{25}$ and $Q_{26}$. The signal at the node $N_3$ is the refresh request signal RFQ. The gates of the transistors $Q_{23}$ and $Q_{26}$ are supplied with the signal TCCS, and the signal $\overline{TCCS}$ is supplied to the gates of $Q_{24}$ and $Q_{25}$.

Figure 6:
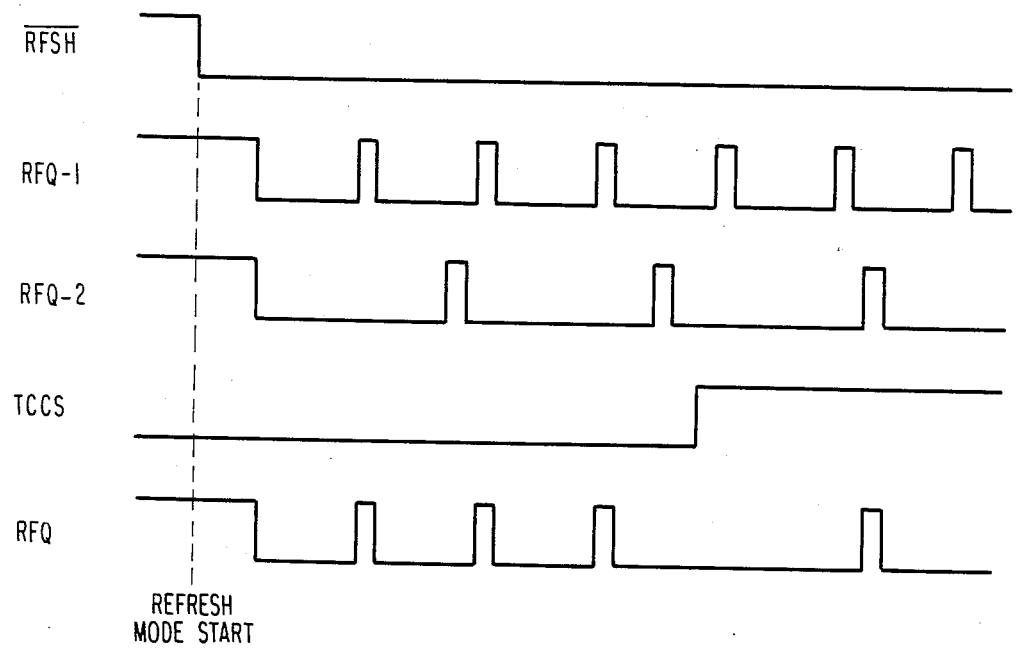
FIG. 6 is a signal waveform diagram for explaining a circuit operation of FIG. 5.

As shown in FIG. 6, when the signal TCCS takes a low level, that is, when the ambient temperature is equal to or higher than a predetermined temperature, the transistors $Q_{23}$ and $Q_{24}$ are made conductive to output the signal RFQ-1 having the first circle as the refresh request signal RFQ. When the signal TCCS is changed to the high level, the transistors $Q_{25}$ and $Q_{26}$ are turned on, so that the signal RFQ-2 having the longer cycle is outputted as the refresh request signal RFQ.

Also, in FIG. 5, three or more timer circuits may be provided in parallel and by selecting one of them the cycle of the self-refresh may be changed in accordance with three or more operating temperature.

The present invention is not limited to the above embodiments, but may be changed and modified without departing from the scope and spirit of the present invention. For example, the memory device may be constituted by only P-channel MOS transistors or N-channel MOS transistors. The cycle of the self-refresh operation may be made long when the signal TCCS takes the low level and short when it takes the high level.

What is claimed is:

1. A semiconductor memory comprising:
a plurality of address terminals;
a row address strobe terminal;
a column address strobe terminal;
a read/write control terminal;
a refresh terminal;
a memory cell array;
a first circuit coupled to said address terminals, said row address strobe terminal, said column address strobe terminal, said read/write control terminal and said memory cell array and activated during a data-read or data-write period in accordance with a level at said read/write control terminal to read data stored in a selected memory cell in said memory cell array or to write data in the selected memory cell; and
a second circuit coupled to said refresh terminal, said memory cell array and one terminal selected from said address terminals, said column address strobe terminal and said read/write control terminal and activated during a self-refresh period to refresh at least one memory cell in said memory cell array, said second circuit including an oscillator generating an oscillation signal, means for receiving a temperature detection signal supplied to said one terminal during said self-refresh period, said temperature detection signal taking a first level when an ambient temperature is equal to or higher than a predetermined value and a second level when the ambient temperature is lower than said predetermined value, and a timer circuit receiving said oscillation signal and an output of said receiving means and generating a refresh request signal in a first cycle when said temperature detection signal takes said first level and in a second cycle when said temperature detection signal takes said second level, said second circuit refreshing the memory cell in said memory cell array in response to said refresh request signal.

2. The semiconductor memory as claimed in claim 1, wherein said one terminal is said column address strobe terminal.

3. A memory device comprising:
a plurality of memory cells;
an oscillator for generating an oscillation signal;
a first capacitor;
a second capacitor;
a switch circuit provided between said first and second capacitors;
control means for controlling a state of said switch circuit;
charging means for charging said first capacitor when said switch circuit is in an off-state, and for charging both of said first and second capacitors when said switch circuit is in an on-state;
discharging means responsive to said oscillation signal for periodically discharging said first capacitor when said switch circuit is in the off-state, and for discharging both of said first and second capacitors when said switch circuit is in the on-state;
detecting means for detecting a voltage across said first capacitor; and refresh means responsive to an output of said detecting means for refreshing at least one of said memory cells.

4. A semiconductor memory fabricated as an integrated circuit device comprising:
   a plurality of memory cells formed in said integrated circuit device;
   an oscillator formed in said integrated circuit device and generating a train of pulses in a predetermined frequency, said train of pulses being utilized to bias a semiconductor substrate of said integrated circuit device;
   a timer circuit formed in said integrated circuit device and receiving said train of pulses;
   a timer control circuit formed in said integrated circuit device and producing an operation control signal;
   means formed in said integrated circuit device for supplying said operation control signal to said timer circuit,
   said timer circuit operating in a first state, when said operation control signal takes a first level, to generate a refresh request signal every time a first number of said pulses are supplied thereto,
   said timer circuit operating in a second state, when said operation control signal takes a second level, to generate said refresh request signal every time a second number of said pulses are supplied thereto, said first number being different from said second number, and
   means formed in said integrated circuit device and responsive to said refresh request signal for refreshing said memory cells.

5. The memory as claimed in claim 4, wherein said timer control circuit produces said operation control signal in response to an ambient temperature detection signal, said operation control signal taking said first level when an ambient temperature is equal to or higher than a predetermined value and said second level when the ambient temperature is lower than said predetermined value.

6. A semiconductor memory comprising:
   a plurality of memory cells;
   a power supply terminal;
   a reference terminal;
   first and second nodes;
   an oscillator for generating an oscillation signal;
   a first transistor coupled between said first node and said reference terminal;
   means for operatively supplying said oscillation signal to said first transistor, said first transistor producing a current path between said first node and said reference terminal in a cycle period that is determined by a cycle of said oscillation signal to decrease periodically a potential at said first node;
   a first capacitor connected between said first node and said reference terminal;
   means for detecting the potential at said first node to produce a refresh request signal when the potential at said first node is decreased to a predetermined level;
   means responsive to said refresh request signal for refreshing at least one of said memory cells;
   means for generating a refresh end signal when the refreshing of said at least one of said memory cells ends;
   a second transistor connected between said power supply terminal and said first node and supplied with said refresh end signal, said second transistor producing a current path between said power supply terminal and said first node in response to said refresh end signal thereby to increase the potential at said first node to a level at said power supply terminal;
   a second capacitor connected between said second node and said reference terminal;
   a switch circuit connected between said first and second nodes;
   means for producing a temperature detection signal, said temperature detection signal taking a first level when an ambient temperature is equal to or higher than a predetermined value and a second level when the ambient temperature is lower than said predetermined value; and
   means for supplying said temperature detection signal to said switch circut, said switch circuit being turned ON when said temperature detection signal takes said first level to connect said first node to said second node and turned OFF when said temperature detection signal takes said second level to disconnect said first node from said second node.

7. The memory as claimed in claim 6, further comprising a third transistor connected between said power supply terminal and said second node, said third transistor being turned ON when said temperature detection signal takes said second level and turned OFF when said temperature detection signal takes said first level.

8. A semiconductor memory comprising:
   a plurality of memory cells;
   a refresh terminal is applied in a self-refresh mode;
   address terminals supplied with address signals;
   at least one address control terminal supplied with an address control signal;
   a read/write control terminal supplied with a read/write control signal;
   first means responsive to the application of said refresh signal to said refresh terminal for performing a self-refresh operation for refreshing said plurality of memory cells; and
   second means responsive to said address signals, said address control signal and said read/write control signal for performing a data-read or data-write operation in accordance with a level of said read/write control signal when said refresh signal is not applied to said refresh terminal,
   said first means including an oscillator generating an oscillation signal having a first cycle, a timer control circuit detecting a potential at one terminal selected from said address terminals, said at least one address control terminal and said read/write control terminal and producing a detection signal when said potential at said one terminal assumes a first logic level, a timer circuit receiving said oscillation signal and generating a refresh request signal in a second cycle when said detection signal is not produced and in a third cycle when said detection signal is produced, said first, second and third cycles being different from one another, and means responsive to said refresh request signal for refreshing said plurality of memory cells.

9. A semiconductor memory as claimed in claim 8, wherein said one terminal receives a temperature detection signal in response to which said first means performs the self-refresh operation, said temperature detection signal taking a second logic level when an ambient temperature is equal to or higher than a predetermined value and said first logic level when the ambient temperature is lower than said predetermined value, and said second cycle is shorter than said third cycle.

10. The semiconductor memory as claimed in claim 9, wherein said timer circuit includes a first capacitor connected between a circuit node and a reference potential, a second capacitor, means for connecting said second capacitor in parallel with said first capacitor when said detection signal is produced, means responsive to said oscillation signal for discharging periodically said circuit node, means for generating said refresh request signal when a potential at said circuit node is reduced to a predetermined level, and means for charging said circuit node after said refresh request signal is generated.

* * * * *